(12) United States Patent
Ko et al.

(10) Patent No.: US 12,716,557 B2
(45) Date of Patent: Aug. 25, 2026

(54) LIGHT SOURCE UNIT FOR PLANT CULTIVATION AND PLANT CULTIVATION ASSEMBLY HAVING THE SAME

(71) Applicant: SEOUL VIOSYS CO., LTD., Ansan-si (KR)

(72) Inventors: Sang Min Ko, Ansan-si (KR); Jin Won Kim, Ansan-si (KR)

(73) Assignee: SEOUL VIOSYS CO., LTD., Ansan-si (KR)

( * ) Notice: Subject to any disclaimer, the term of this patent is extended or adjusted under 35 U.S.C. 154(b) by 0 days.

(21) Appl. No.: 19/226,951

(22) Filed: Jun. 3, 2025

(65) Prior Publication Data

US 2025/0290608 A1 Sep. 18, 2025

Related U.S. Application Data

(63) Continuation of application No. 18/598,716, filed on Mar. 7, 2024, now Pat. No. 12,338,961, which is a (Continued)

(51) Int. Cl.
*F21K 9/64* (2016.01)
*A01G 7/04* (2006.01)

(Continued)

(52) U.S. Cl.
CPC ................ *F21K 9/64* (2016.08); *A01G 7/045* (2013.01); *H10H 20/8513* (2025.01); *F21Y 2115/10* (2016.08)

(58) Field of Classification Search
CPC ........... A01G 7/045; F21K 9/64; F21V 13/08; F21V 3/08; F21V 9/30; F21V 9/32; F21V 9/38; F21Y 115/10
See application file for complete search history.

(56) References Cited

U.S. PATENT DOCUMENTS 9,927,097 B2 * 3/2018 Lalicki ..................... F21V 9/30
2016/0178140 A1 6/2016 Cho (Continued)

FOREIGN PATENT DOCUMENTS

CN 102382648 A 3/2012
CN 105240748 A 1/2016

(Continued)

OTHER PUBLICATIONS

International Search Report for International Application No. PCT/KR2021/002910, mailed Jul. 2, 2021, English translation, 2 pages.

(Continued)

*Primary Examiner* — William J Carter
(74) *Attorney, Agent, or Firm* — Oblon, McClelland, Maier & Neustadt, L.L.P.

(57) ABSTRACT

A light source unit for plant cultivation includes: a first light emitter emitting a primary light and a converter disposed on a path of the primary light to produce a first light, and a second light emitter emitting a second light, wherein combined light emitted from the first light emitter and the second light emitter produces a basic spectrum including at least three peak wavelengths, with a difference between relative intensities of at least two of the peak wavelengths being less than 20%.

20 Claims, 10 Drawing Sheets

100

Related U.S. Application Data continuation of application No. 18/093,137, filed on Jan. 4, 2023, now Pat. No. 11,953,163, which is a continuation of application No. 16/984,484, filed on Aug. 4, 2020, now Pat. No. 11,578,839.

(60) Provisional application No. 62/883,780, filed on Aug. 7, 2019.

(51) Int. Cl.
*F21Y 115/10* (2016.01)
*H10H 20/851* (2025.01)

(56) References Cited

U.S. PATENT DOCUMENTS

| | | | |
|---|---|---|---|
| 2017/0030555 | A1 | 2/2017 | Lalicki et al. |
| 2017/0098736 | A1 | 4/2017 | Lee et al. |
| 2017/0238390 | A1 | 8/2017 | Yamakawa et al. |
| 2017/0345976 | A1 | 11/2017 | Asai |
| 2018/0054975 | A1 | 3/2018 | Shur |
| 2018/0135830 | A1* | 5/2018 | Cai ........................ A01G 7/045 |
| 2019/0183059 | A1 | 6/2019 | Yun et al. |
| 2019/0191517 | A1 | 6/2019 | Adams et al. |
| 2020/0010759 | A1 | 1/2020 | Benker et al. |

FOREIGN PATENT DOCUMENTS

| | | | |
|---|---|---|---|
| CN | 106090706 | A | 11/2016 |
| CN | 107623064 | A | 1/2018 |
| CN | 109103174 | A | 12/2018 |
| CN | 109370593 | A | 2/2019 |
| EP | 2772952 | A1 | 3/2014 |
| EP | 3214359 | A1 | 6/2017 |
| JP | 2002281830 | A | 10/2002 |
| JP | 2011/016521 | A1 | 2/2011 |
| JP | 2013/061942 | A1 | 5/2013 |
| JP | 2013-201902 | A | 10/2013 |
| JP | 2015133939 | A | 7/2015 |
| JP | 2016/067609 | A1 | 5/2016 |
| JP | 2016-86783 | A | 5/2016 |
| JP | 2016-202148 | | 12/2016 |
| KR | 1020120021415 | | 3/2012 |
| KR | 1020160081470 | A | 7/2016 |
| KR | 1020170040696 | | 4/2017 |
| KR | 1020170090317 | A | 8/2017 |
| KR | 10-1908239 | B1 | 10/2018 |
| KR | 1020200024607 | A | 3/2020 |
| RU | 148495 | U1 | 12/2014 |
| RU | 2565724 | C1 | 10/2015 |
| WO | WO 2013/108332 | A1 | 7/2013 |
| WO | WO 2018162375 | A2 | 9/2018 |
| WO | WO 018179105 | | 10/2018 |

OTHER PUBLICATIONS

International Search Report for International Application No. PCT/KR2020/010384, mailed Nov. 13, 2020, English translation, 3 pages.
Office Action issued in U.S. Appl. No. 17/194,906, dated Sep. 30, 2021, 8 pages.
Final Office Action, U.S. Appl. No. 17/194,906, mailed Apr. 11, 2022, 9 pages.
Notice of Allowance, U.S. Appl. No. 17/194,906, mailed Aug. 25, 2022, 5 pages.
Notice of Allowance, U.S. Appl. No. 17/194,906, mailed Dec. 20, 2022, 5 pages.
Office Action issued in U.S. Appl. No. 16/984,484, dated Sep. 27, 2021, 9 pages.
Final Office Action issued in U.S. Appl. No. 16/984,484, dated Apr. 8, 2022, 11 pages.
Notice of allowance issued in U.S. Appl. No. 16/984,484, dated Aug. 2, 2022, 7 pages.
Notice of allowance issued in U.S. Appl. No. 16/984,484, dated Dec. 8, 2022, 5 pages.
English translation of Office Action for Russian Patent Application No. 2022105788, mailed Dec. 21, 2022, 9 pages.
Office Action for Chinese Patent Application No. 202080004538.3 with English translation, mailed Feb. 16, 2023, 14 pages.
Search Report for European Patent Application No. 20850031.4, mailed on Aug. 9, 2023, 9 pages.
Final office action for U.S. Appl. No. 18/108,862, mailed Jun. 13, 2023, 8 pages.
Notice of Allowance for U.S. Appl. No. 18/108,862, mailed Sep. 5, 2023, 5 pages.
Chinese Office Action issued Mar. 15, 2024, in Chinese Patent Application No. 202080004538.3, 5 pages.
Cui et al., "Plants and Plant Physiology Experiments", Huazhong University of Science and Technology Press, Jul. 2012, 20 pages (w/English abstract).
Cai, "Plant Physiology", China Agricultural University Press, 2008, 18 pages (w/English abstract).
Japanese Office Action issued Jul. 9, 2024, in Japanese Patent Application No. 2022-507555, 5 pages.
Office Action mailed Jan. 28, 2025, in Japanese Application No. 2022-507555 filed Aug. 6, 2020 (w/English translation).
Korean Office Action issued Sep. 3, 2025 in Korean Patent Application No. 10-2022-7007693, 6 pages.

* cited by examiner

LIGHT SOURCE UNIT FOR PLANT CULTIVATION AND PLANT CULTIVATION ASSEMBLY HAVING THE SAME

CROSS REFERENCE TO RELATED APPLICATIONS

This application is a continuation of and claims the benefit under 35 U.S.C. § 120 to U.S. application Ser. No. 18/598,716 filed Mar. 7, 2024, which is a continuation of and claims the benefit under 35 U.S.C. § 120 to U.S. application Ser. No. 18/093,137 filed Jan. 4, 2023 (now U.S. Pat. No. 11,953,163 issued Apr. 9, 2024), which is a continuation of and claims the benefit under 35 U.S.C. § 120 to U.S. application Ser. No. 16/984,484 filed Aug. 4, 2020 (now U.S. Pat. No. 11,578,839 issued Feb. 14, 2023), and claims the benefit of U.S. Provisional Application No. 62/883,780 filed Aug. 7, 2019, the entire contents of each of which are incorporated herein by reference.

TECHNICAL FIELD

Exemplary embodiments relate to a light source unit for plant cultivation and a plant cultivation assembly having the same.

BACKGROUND

Plants use light energy to photosynthesis to synthesize organic matter from carbon dioxide and water. Plants use chemical energy of organic matter obtained through photosynthesis as a nutrient for growth or the like.

Plants contain functional substances that are effective in an intended target. Plants have different levels of functional substances depending on their growth and environment. For example, plants protect themselves by producing antioxidants to defend against damage caused by oxidation stress. When a person ingests plants that contain many of these functional substances, the functional substances have similar effects on a human body. Therefore, to obtain the functional substances efficiently, plants should be harvested when plants contain as many functional substances as possible.

Recently, techniques for cultivating plants using light sources other than sunlight have been researched, and in particular, plant cultivation using an LED has become available. LED light sources are more productive in plant cultivation than natural light as plants can be grown regardless of weather, time, or place.

Therefore, there is a need to provide an LED light source capable of rapidly growing plants to be nutritious and rich in functional substances such as antioxidants.

SUMMARY

Exemplary embodiments provide a light source unit for plant cultivation which is suitable for enhancing a growth rate of plants while increasing functional substances thereof and a plant cultivation assembly having the same.

An LED light source unit for plant cultivation according to an exemplary embodiment includes: at least one first light emitting diode chip emitting light of 430 nm or less; and at least three types of phosphors excited by the at least one first light emitting diode chip, in which the three types of phosphors include: a first phosphor having a peak wavelength within a first wavelength range of 440 nm to 480 nm; a second phosphor having a peak wavelength within a second wavelength range of 500 nm to 600 nm; and a third phosphor having a peak wavelength within a third wavelength range of 600 nm to 650 nm, and combination of light emitted from the first light emitting diode chip and the at least three types of phosphors produces a basic spectrum of white light having a color temperature of 5000K or more.

In addition, a plant cultivation assembly according to an exemplary embodiment includes the LED light source unit for plant cultivation.

An LED light source unit for plant cultivation according to another exemplary embodiment includes at least one first light emitting diode chip emitting light of 430 nm or less; and at least three types of phosphors excited by the at least one first light emitting diode chip, in which the LED light source unit emits white light of a basic spectrum having a color temperature of 5000K or more by the light emitting diode chip and the phosphors, when defining a relative intensity at each wavelength of the basic spectrum based on a maximum intensity of the basic spectrum, in the basic spectrum, a difference between a maximum value of a relative intensity within a first wavelength range and a maximum value of a relative intensity within a second wavelength range is less than 20%, and a difference between the maximum value of the relative intensity within the second wavelength range and a maximum value of a relative intensity within a third wavelength range is less than 20%.

Exemplary embodiments provide a light source for plant cultivation helping plant growth and increases contents of functional substances in plants.

BRIEF DESCRIPTION OF DRAWINGS

FIG. 7A is a graph showing fresh weights of lettuces grown for 2 weeks.

FIG. 7B is a graph showing dry weights thereof, similar to the fresh weights.

FIG. 7C is a graph showing total phenolic contents per cultivated plant.

FIG. 7D is a graph showing antioxidant capacities per cultivated plant.

FIG. 7E is a graph showing relative contents of flavonol measured using duallex, a non-destructive plant composition analyzer.

FIG. 7F is a graph showing relative contents of anthocyanin measured using duallex, a non-destructive plant composition analyzer.

FIG. 8A is a graph showing fresh weights of lettuces grown for 2 weeks.

FIG. 8B is a graph showing dry weights thereof, showing a similar pattern to the fresh weights.

FIG. 8C is a graph showing total phenolic contents per cultivated plant.

FIG. 8D is a graph showing antioxidant capacities per cultivated plant.

FIG. 8E is a graph showing relative contents of flavonol measured using duallex, a non-destructive plant composition analyzer.

FIG. 8F is a graph showing relative contents of anthocyanin measured using duallex, a non-destructive plant composition analyzer.

DETAILED DESCRIPTION

Figure 1:
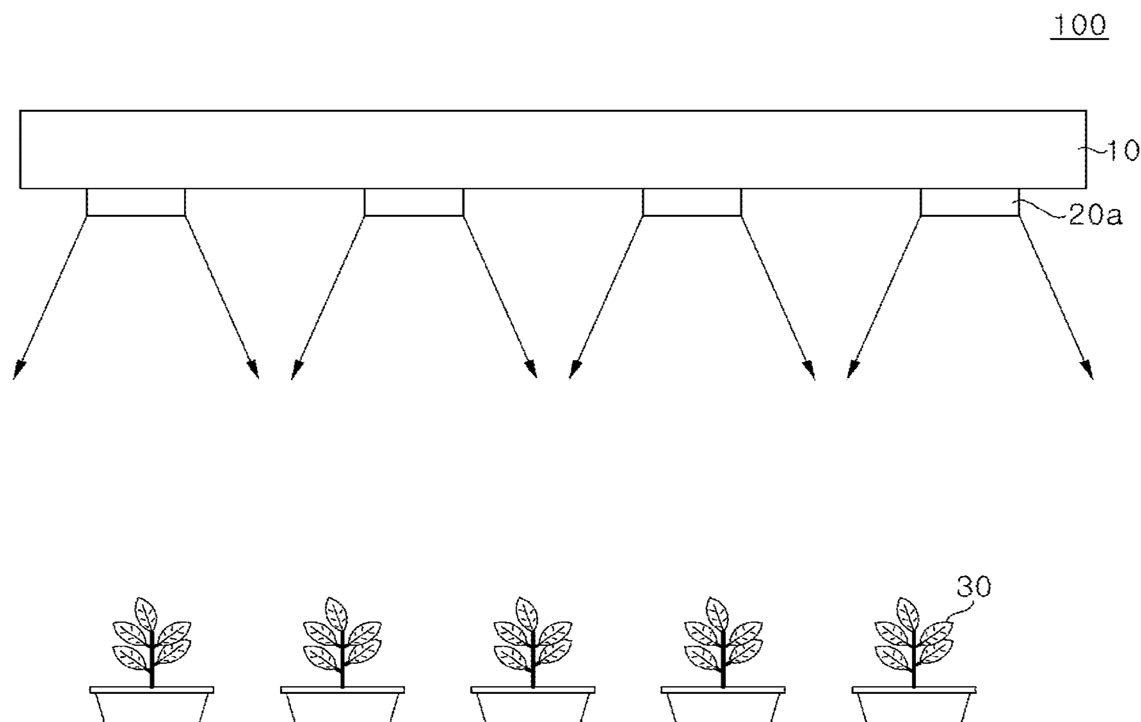
FIG. 1 is a schematic cross-sectional view illustrating a plant cultivation assembly according to an exemplary embodiment.

Hereinafter, embodiments will be described in detail with reference to the accompanying drawings. The following embodiments are provided by way of example so as to fully convey the spirit of the present disclosure to those skilled in the art to which the present disclosure pertains. Accordingly, the present disclosure is not limited to the embodiments disclosed herein and can also be implemented in different forms. In the drawings, widths, lengths, thicknesses, and the like of devices can be exaggerated for clarity and descriptive purposes. Throughout the specification, like reference numerals denote like devices having the same or similar functions.

An LED light source unit for plant cultivation according to an exemplary embodiment includes: at least one first light emitting diode chip emitting light of 430 nm or less; and at least three types of phosphors excited by the at least one first light emitting diode chip, in which the three types of phosphors include: a first phosphor having a peak wavelength within a first wavelength range of 440 nm to 480 nm; a second phosphor having a peak wavelength within a second wavelength range of 500 nm to 600 nm; and a third phosphor having a peak wavelength within a third wavelength range of 600 nm to 650 nm, and combination of light emitted from the first light emitting diode chip and the at least three types of phosphors produces a basic spectrum of white light having a color temperature of 5000K or more.

Since the first, second, and third phosphors are used, the basic spectrum having a substantially uniform intensity over a relatively wide visible region may be provided, thereby promoting plant growth.

In particular, when defining a relative intensity at each wavelength of the basic spectrum based on a maximum intensity of the basic spectrum, in the basic spectrum, a difference between a maximum value of a relative intensity within the first wavelength range and a maximum value of a relative intensity within the second wavelength range may be less than 20%, and a difference between the maximum value of the relative intensity within the second wavelength range and a maximum value of a relative intensity within the third wavelength range may be less than 20%.

Further, a difference between a maximum value of a relative intensity within a fourth wavelength range of 400 nm to 430 nm and the maximum value of the relative intensity within the first wavelength range in the basic spectrum may be less than 30%.

In addition, in the basic spectrum, the difference between the maximum value of the relative intensity within the first wavelength range and the maximum value of the relative intensity within the second wavelength range may be less than 10%, and the difference between the maximum value of the relative intensity within the second wavelength range and the maximum value of the relative intensity within the third wavelength range may be less than 10%.

The LED light source unit may further include a second light emitting diode chip having a peak wavelength within a fifth wavelength range of 650 nm to 680 nm.

The LED light source unit may further include a third light emitting diode chip, in which the first light emitting diode chip may have a peak wavelength in a range of 410 nm to 430 nm, and the third light emitting diode chip may emit ultraviolet light or blue light having a peak wavelength in a range of 440 nm to 460 nm.

In an exemplary embodiment, combination of light emitted from the first light emitting diode chip and the first, second, and third phosphors may produce a basic spectrum of white light having a color temperature of 5000K or more.

A plant cultivation assembly according to an exemplary embodiment includes: a first LED light source unit for plant cultivation, in which the first LED light source unit includes at least one first light emitting diode chip emitting light of 430 nm or less; and at least three types of phosphors excited by the at least one first light emitting diode chip, the three types of phosphors include: a first phosphor having a peak wavelength within a first wavelength range of 440 nm to 480 nm; a second phosphor having a peak wavelength within a second wavelength range of 500 nm to 600 nm; and a third phosphor having a peak wavelength within a third wavelength range of 600 nm to 650 nm, and combination of light emitted from the first light emitting diode chip and the at least three types of phosphors produces a basic spectrum of white light having a color temperature of 5000K or more.

The plant cultivation assembly may further include a second light source unit, in which the second light source unit may include a second light emitting diode chip having a peak wavelength in a fifth wavelength range of 650 nm to 680 nm.

In addition, the plant cultivation assembly may further include a panel on which the first light source unit and the second light source unit are disposed.

The plant cultivation assembly may further include a third light source unit, in which the third light source unit may include a light emitting diode chip emitting ultraviolet light or blue light.

The plant cultivation assembly may further include a panel on which the first light source unit and the third light source unit are disposed.

In an exemplary embodiment, the first light source unit may further include a second light emitting diode chip having a peak wavelength within the fifth wavelength range of 650 nm to 680 nm.

In an exemplary embodiment, the first light source unit may further include a third light emitting diode chip, in which the first light emitting diode chip may have a peak wavelength in a range of 410 nm to 430 nm, and the third light emitting diode chip may emit ultraviolet light or blue light having a peak wavelength in a range of 440 nm to 460 nm.

In an exemplary embodiment, combination of light emitted from the first light emitting diode chip and the first, second, and third phosphors may produce a basic spectrum of white light having a color temperature of 5000K or more. However, the inventive concepts are not limited thereto, and light emitted from other phosphors may be further combined to produce white light of the basic spectrum.

An LED light source unit for plant cultivation according to another exemplary embodiment may include at least one first light emitting diode chip emitting light of 430 nm or less; and at least three types of phosphors excited by the at least one first light emitting diode chip, in which the LED light source unit emits white light of a basic spectrum having a color temperature of 5000K or more by the light emitting diode chip and the phosphors, when defining a relative intensity at each wavelength of the basic spectrum based on a maximum intensity of the basic spectrum, in the basic spectrum, a difference between a maximum value of a relative intensity within a first wavelength range and a maximum value of a relative intensity within a second wavelength range may be less than 20%, and a difference between the maximum value of the relative intensity within the second wavelength range and a maximum value of a relative intensity within a third wavelength range may be less than 20%.

Further, in the basic spectrum, a difference between the maximum value of the relative intensity within the first wavelength range and the maximum value of the relative intensity within the second wavelength range may be less than 10%, and a difference between the maximum value of the relative intensity within the second wavelength range and the maximum value of the relative intensity within the third wavelength range may be less than 10%.

Hereinafter, exemplary embodiments of the present disclosure will be described in detail with reference to the accompanying drawings.

Figure 2:
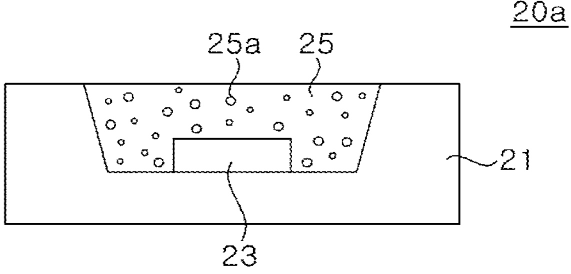
FIG. 2 is a schematic cross-sectional view illustrating a light source unit for plant cultivation according to an exemplary embodiment.

FIG. 1 is a schematic cross-sectional view illustrating a plant cultivation assembly 100 according to an exemplary embodiment, and FIG. 2 is a schematic cross-sectional view illustrating a light source unit 20*a* for plant cultivation according to an exemplary embodiment.

Referring to FIG. 1, the plant cultivation assembly 100 may include a panel 10 and the LED light source unit 20*a*. The panel 10 is not particularly limited in shape, size and material as long as it is capable of arranging a plurality of LED light source units 20*a*.

One or more LED light source units 20*a* may be arranged on the panel 10. The LED light source units 20*a* irradiate light to plants 30 growing in a container 40 for plant cultivation. Many plants may be arranged for mass cultivation, and plants may be uniformly irradiated with light from the plurality of LED light source units 20*a* arranged on the panel 10.

Referring to FIG. 2, the LED light source unit 20*a* may include a base 21, a light emitting diode chip 23, and a wavelength converter 25, and the wavelength converter 25 includes phosphors 25*a*.

The base 21 may include leads (not shown in the drawing) for electrical connection to an external power supply. The base 21 may also include a cavity for mounting the light emitting diode chip 23 therein. However, the base 21 is not limited to a specific structure as long as it provides leads for connecting the light emitting diode chip 23 to the external power supply, and the base 21 may be leads provided from a lead frame or a circuit board. Moreover, if the light emitting diode chip 23 can be directly mounted on the panel 10, the base 21 may be omitted.

The light emitting diode chip 23 may be mounted on the base 21, and may be electrically connected to the leads of the base 21. The light emitting diode chip 23 may be formed of, for example, a group III nitride-based semiconductor layer.

In some embodiments, the light emitting diode chip 23 emits light of 430 nm or less in its wavelength. By way of example, the light emitting diode chip 23 may have a peak wavelength in a range of 400 nm to 430 nm. Specifically, the peak wavelength may be in a range of 405 nm to 420 nm, and additionally, in a range of 410 nm to 420 nm. In other embodiments, the light emitting diode chip 23 may emit visible light of short wavelength of 400 nm or less or ultraviolet light.

The wavelength converter 25 is disposed on a path of light emitted from the light emitting diode chip 23. As shown in FIG. 2, the wavelength converter 25 may cover the light emitting diode chip 23 and may be, for example, an encapsulant of the light emitting diode chip 23. The wavelength converter 25 may include a transparent member containing the phosphor 25*a*. The transparent member may be, for example, glass or a transparent resin such as epoxy or silicone. In an exemplary embodiment, the wavelength converter 25 may be formed in the cavity of the base 21. In another exemplary embodiment, the wavelength converter 25 may be formed directly on the light emitting diode chip 23.

The wavelength converter 25 includes at least three types of phosphors 25*a* having different peak wavelengths. For example, a first phosphor may have a peak wavelength within a first wavelength range of 440 nm to 480 nm. The first phosphor may include BAM-based, Halo-Phosphate-based or aluminate-based phosphors, and may include, for example, $BaMgAl_{10}O_{17}:Mn^{2+}$, $BaMgAl_{12}O_{19}:Mn^{2+}$, or $(Sr,Ca,Ba)PO_4Cl:Eu^{2+}$. A blue phosphor may have a peak wavelength within a range of 440 nm to 500 nm, for example.

A second phosphor may have a peak wavelength within a second wavelength range of 500 nm to 600 nm. The second phosphor may include LuAG($Lu_3(Al,Gd)_5O_{12}:Ce^{3+}$), YAG ($Y_3(Al,Gd)_5O_{12}:Ce^{3+}$), Ga-LuAG($(Lu,Ga)_3(Al,Gd)_5O_{12}:Ce^{3+}$), Ga-YAG($(Ga,Y)_3(Al,Gd)_5O_{12}:Ce^{3+}$), LuYAG($(Lu,Y)_3(Al,Gd)_5O_{12}:Ce^{3+}$), Ortho-Silicate($(Sr,Ba,Ca,Mg)_2SiO_4:Eu^{2+}$), Oxynitride($(Ba,Sr,Ca)Si_2O_2N_2:Eu^{2+}$), or Thio Gallate($SrGa_2S_4:Eu^{2+}$).

A third phosphor may have a peak wavelength within a third wavelength range of 600 nm to 650 nm. The third phosphor may include Nitride, Sulfide, Fluoride, or Oxynitride phosphors, and specifically, may include CASN ($CaAlSiN_3:Eu^{2+}$), $(Ba,Sr,Ca)_2Si_5N_8:Eu^{2+}$, ($(Ca,Sr)S_2:Eu^{2+}$), or $(Sr,Ca)_2SiS_4:Eu^{2+}$.

In FIG. 2, the light source unit 20*a* is illustrated as including a single light emitting diode chip 23, but the inventive concepts are not limited thereto, and may include a plurality of light emitting diode chips 23. Furthermore, in addition to the light emitting diode chip 23, a light emitting diode chip that emits light in the ultraviolet or red region may be included.

Figure 3:
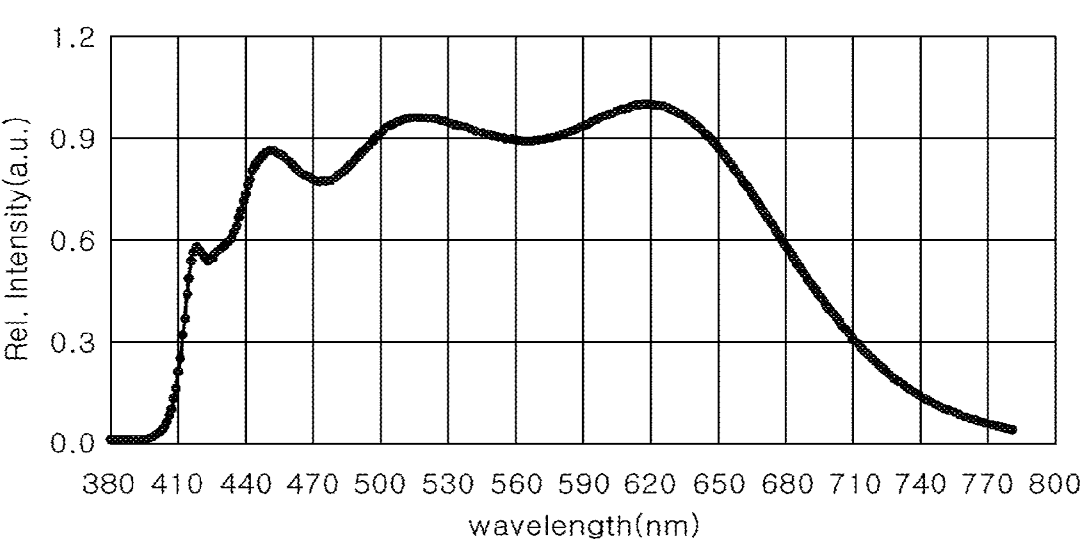
FIG. 3 is a graph illustrating a spectrum of a light source unit according to an exemplary embodiment.

FIG. 3 is a graph illustrating a spectrum of the light source unit 20*a* according to an exemplary embodiment.

Referring to FIG. 3, the light source unit 20*a* according to the exemplary embodiment of the present disclosure emits white light by the light emitting diode chip 23 and the first, second, and third phosphors. In particular, the spectrum of the light source unit 20*a* is a basic spectrum used for plant cultivation, to which a spectrum by another light source unit 20*a* or another light emitting diode chip may be added.

FIG. 3 illustrates a spectrum having a color temperature of about 5000K, and shows a spectrum similar to that of blackbody radiation over a wavelength range of 440 nm to 650 nm. However, the inventive concepts are not limited to the color temperature 5000K. The light source unit 20*a* may produce a basic spectrum of, for example, a color temperature of 5000K or more and 10000K or less by the first light emitting diode chip 23 and the phosphors 25*a*. FIG. 3 is a graph relating to the basic spectrum, specifically a graph showing a relative intensity at each wavelength based on a maximum intensity in the basic spectrum. In FIG. 3, the relative intensity is displayed along Y axis and the unit is a.u. which stands for an arbitrary unit of measurement to show the ratio of amount of intensity to a predetermined reference measurement. As shown in FIG. 3, the basic spectrum has the maximum intensity at the wavelength of 620 nm. The maximum intensity is set to be the value of 1 at 620 nm to determine a relative intensity at other wavelengths. Intensities at other wavelengths are set relative to the maximum value of 1 at 620 nm, which are relatively lower than the maximum value of 1.

With respect to a first wavelength range that does not include 620 nm, a maximum value of a relative intensity is present as to a certain wavelength within the first wavelength range. Also, with respect to a second wavelength range that does not include 620 nm, a maximum value of a relative intensity is present as to another certain wavelength within the second wavelength range. Additionally, respect to a third wavelength range that does not include 620 nm, a maximum value of a relative intensity is present as to yet another certain wavelength within the third wavelength range. As shown in FIG. 3, the relative intensity at each wavelength of the basic spectrum is defined based on the maximum intensity of the basic spectrum (i.e., at 620 nm). In some embodiments of the present disclosure, a difference between the maximum value of the relative intensity within the first wavelength range and the maximum value of the relative intensity within the second wavelength range, in the basic spectrum, may be less than 20%, furthermore, less than 10%. Additionally, in some embodiments, a difference between the maximum value of the relative intensity within the second wavelength range and the maximum value of the relative intensity within the third wavelength range may be less than 20%, furthermore, less than 10%.

With respect to a fourth wavelength range that does not include 620 nm, a maximum value of a relative intensity is present as to yet another certain wavelength within the fourth wavelength range. In some embodiments, a difference between a maximum value of a relative intensity within the fourth wavelength range of 400 nm to 430 nm and the maximum value of the relative intensity within the first wavelength range, in the basic spectrum, may be less than 30%.

Since the phosphor generally has a waveform having a relatively wide full-width at half maximum, the phosphor may be capable of emitting light of the high relative intensity over a relatively wide range when the phosphor emits light in the visible region. Accordingly, over the first, second, and third wavelength ranges, the difference in relative intensities at each wavelength may be relatively small. Moreover, valleys between peak wavelengths by the first phosphor, the second phosphor, and the third phosphor may also have relatively high relative intensities.

As such, the basic spectrum of white light similar to that of sunlight may be implemented using the first light emitting diode chip 23 and the phosphors 25*a*, as shown in FIG. 2.

Figure 4:
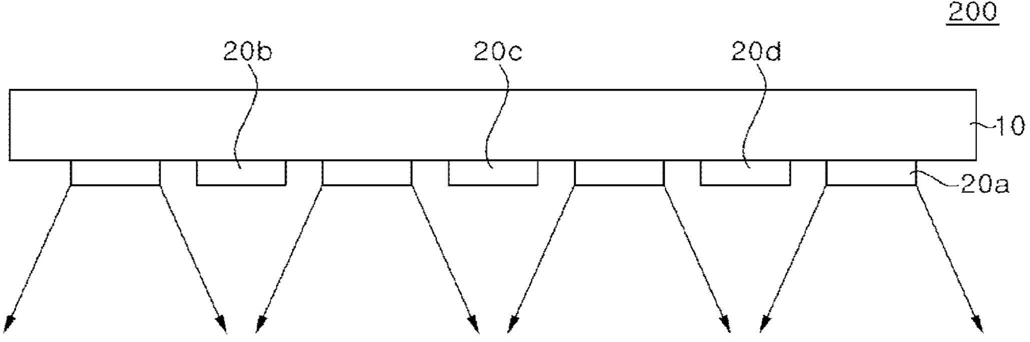
FIG. 4 is a schematic cross-sectional view illustrating a plant cultivation assembly according to another exemplary embodiment.
Figure 4:
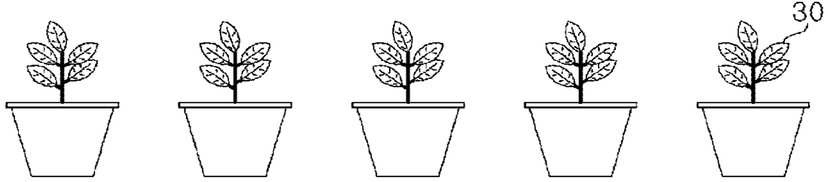

FIG. 4 is a schematic cross-sectional view illustrating a plant cultivation assembly 200 according to another exemplary embodiment.

Referring to FIG. 4, the plant cultivation assembly 200 according to the exemplary embodiment of the present disclosure is substantially similar to the plant cultivation assembly 100 described with reference to FIG. 1, but this embodiment further includes a light source unit 20*b*, 20*c*, or 20*d*.

The light source unit 20*b* may include a light emitting diode chip having a peak wavelength in a range of 650 nm to 680 nm. The light source unit 200 may have a structure similar to that described with reference to FIG. 2, but the phosphors 25*a* are omitted.

Light of 650 nm to 680 nm is known to promote growth in volume of plants. As such, light in the wavelength range of 650 nm to 680 nm is added to the basic spectrum, and thus, growth in volume of plants may be promoted.

The light source unit 20*c* may include a light emitting diode chip having a peak wavelength within a wavelength range of 440 nm to 460 nm. The light source unit 20*c* may include a phosphor, but light having the peak wavelength in the range of 440 nm to 460 nm exhibits a relatively high intensity. Light within the wavelength range of 440 nm to 460 nm activates secondary metabolism of plants and increases plant density. As such, light in the wavelength range of 440 nm to 460 nm is added, and thus, density of plants may be increased.

The light source unit 20*d* may include a light emitting diode chip emitting ultraviolet light. Ultraviolet light may cause stress in plants and increase contents of functional substances. The light source unit 20*d* may include a phosphor, but light having a peak wavelength of ultraviolet light has a relatively high intensity. The spectrum of ultraviolet light may have a peak wavelength in a range of 280~400 nm, in particular, 280~315 nm and it may have a full width at half maximum below about 10 nm.

Figure 5:
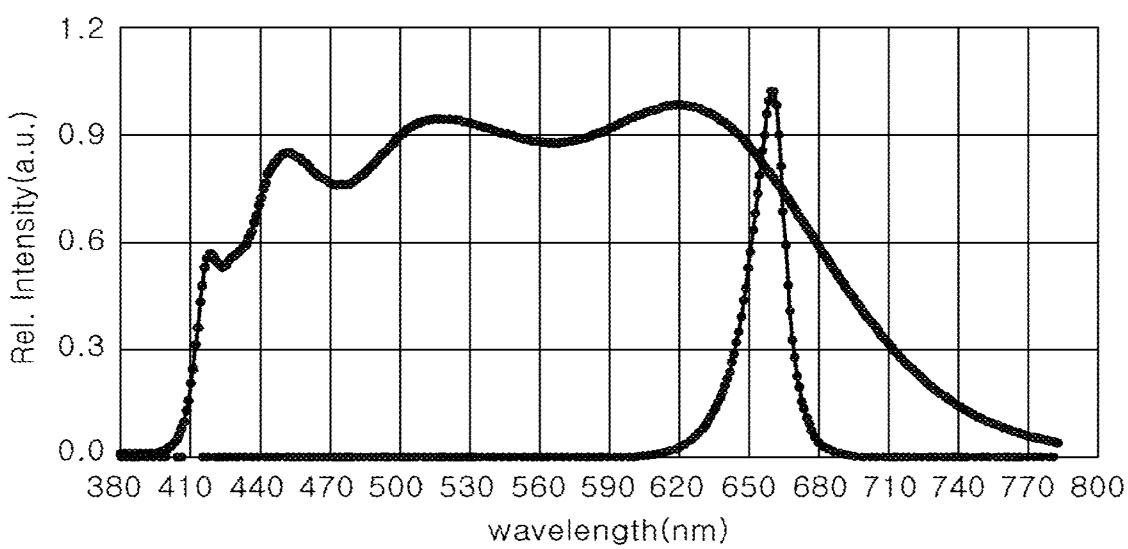
FIG. 5 is a graph illustrating spectrums of light source units for plant cultivation according to another exemplary embodiment.

FIG. 5 is a graph illustrating spectrums of light source units for plant cultivation according to another exemplary embodiment. Herein, spectrums by the light source unit 20*a* and the light source unit 20*b* are shown.

Referring to FIG. 5, the spectrum of the light source unit 20*b* is added to the basic spectrum described with reference to FIG. 3. A total spectrum of the light source unit 20*a* and the light source unit 20*b* may be obtained by adding the spectrums shown in FIG. 5 to each other.

The light source unit 20*b* has a peak wavelength at about 657 nm, emits light in a range of 620 nm to 680 nm, and scarcely emits light outside the wavelength range.

As such, the spectrums of light emitted from the light source unit 20*a* and the light source unit 20*b* are generally similar to the basic spectrum, but will exhibit a relatively high intensity around 657 nm.

Although not shown in the drawing, combination of the light source unit 20*a* and the light source unit 20*c*, or combination of the light source unit 20*a* and the light source unit 20*d* will emit light in which the spectrum of the light source unit 20*c* or 20*d* is added to the basic spectrum.

Any one of the light source units 20*b*, 20*c*, and 20*d*, or two or more light source units may be arranged on a panel 10 together with the light source unit 20*a*.

In the exemplary embodiment of the present disclosure, although it is described that the light source unit 20*b*, 20*c*, or 20*d* is added to the plant cultivation assembly 200, apart from the light source unit 20*a*, the inventive concepts are not limited thereto. For example, a red light emitting diode chip, a blue light emitting diode chip, or an ultraviolet light emitting diode chip may be mounted in the light source unit 20*a*, and accordingly, the light source unit 20*a* may implement light having the spectrum as shown in FIG. 5.

Examples of Experiment

A plant cultivation experiment was conducted in comparison with a conventional white light source to confirm that the light of the basic spectrum was helpful for growth and contents of functional substances of plants. The basic spectrum of Inventive Example is as that shown in FIG. 3, and a basic spectrum of Comparative Example is illustrated in FIG. 6.

Figure 6:
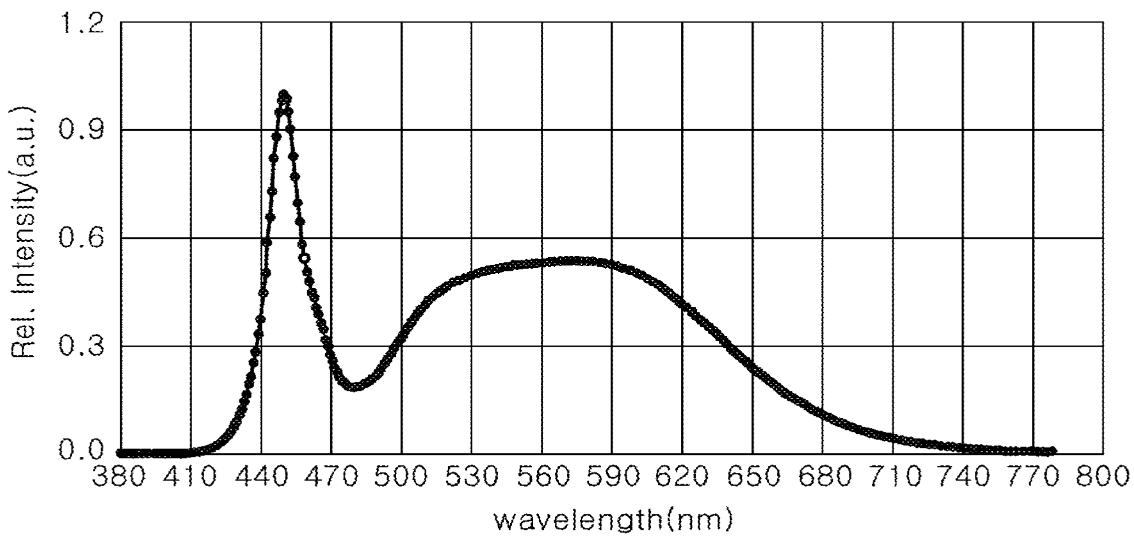
FIG. 6 is a graph illustrating a spectrum of a light source unit of Comparative Example.

As shown in FIG. 6, the spectrum of the light source of Comparative Example is typically implemented by a blue light emitting diode chip and a phosphor. Blue light has a relatively high intensity of peak wavelength thereof compared to that of light emitted by the phosphor.

FIGS. 7A through 7F are graphs illustrating results of plant cultivation depending on use of light sources according to an exemplary embodiment of the present disclosure and use of light sources of Comparative Examples.

Lettuce seedlings grown under the same conditions were divided into four groups of six, and placed in a chamber at a room temperature of 20° C. and a relative humidity of 60%, respectively. The lettuce seedlings were grown for 2 weeks by irradiating the light sources of Inventive Examples 1 and 2 and the light sources of Comparative Examples 1 and 2 at a regular light cycle. Light irradiation/quenching was repeated every 16 hours/8 hours. All of the light sources applied to the experiment emit white light having a color temperature of 5000K, and a photometric condition thereof are 120 PPFD in Inventive Example 1 and Comparative Example 1, and 200 PPFD in Inventive Example 2 and Comparative Example 2. Herein, the PPFD is a photosynthetic photon flux density (PPFD), and a unit thereof is $\mu mol/m^2/s$.

Figure 7A:
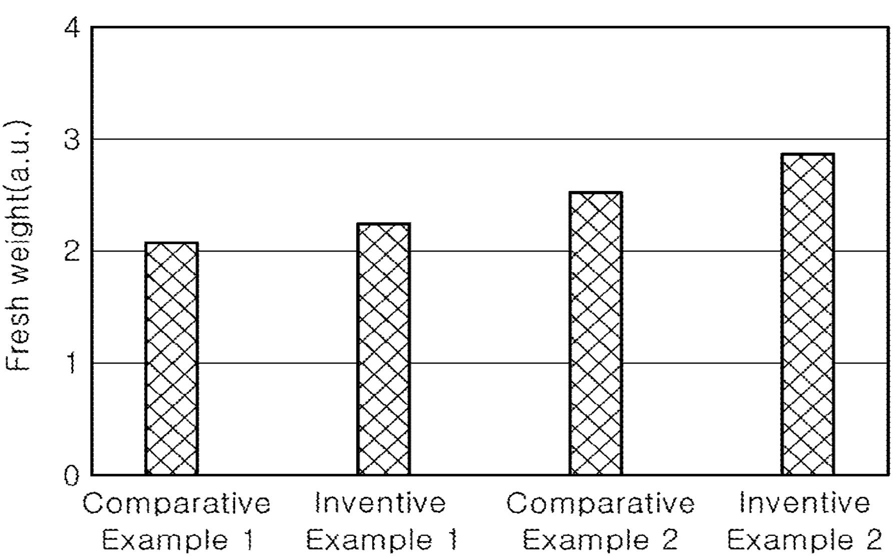
FIGS. 7A through 7F are graphs illustrating results of plant cultivation depending on use of light sources according to an exemplary embodiment of the present disclosure and use of light sources of Comparative Examples.

FIG. 7A is a graph showing fresh weights of lettuces grown for 2 weeks.

Referring to FIG. 7A, the fresh weights of lettuces irradiated with the basic spectrum of the present disclosure were greater than those of lettuces irradiated with the basic spectrum of Comparative Examples under the same photometric condition. That is, even if an amount of light is the same, plant growth may be promoted by irradiating light of a relatively high spectrum over an entire visible region as is in the basic spectrum of the present disclosure.

Figure 7B:
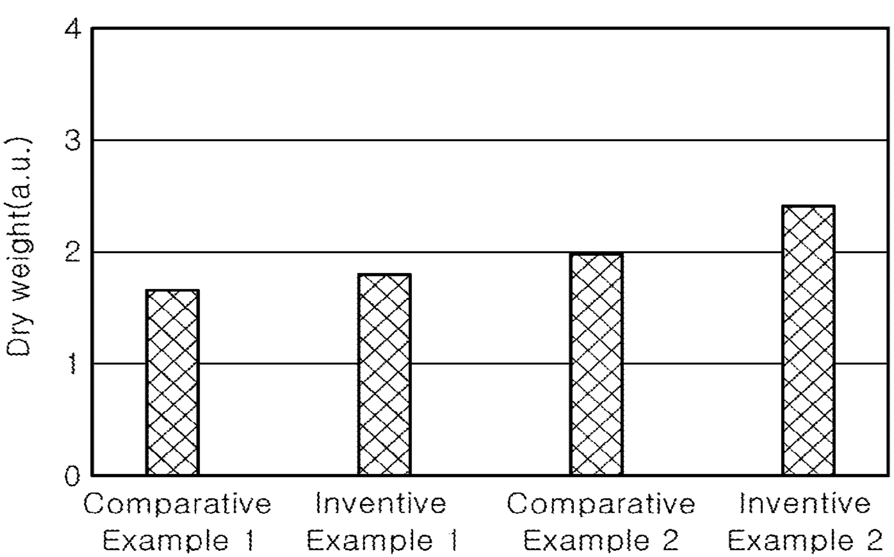

FIG. 7B is a graph showing dry weights thereof, similar to the fresh weights, the dry weights of lettuces grown using the light sources of the Inventive Examples are larger than those of the lettuces grown using the light sources of Comparative Examples.

Figure 7C:
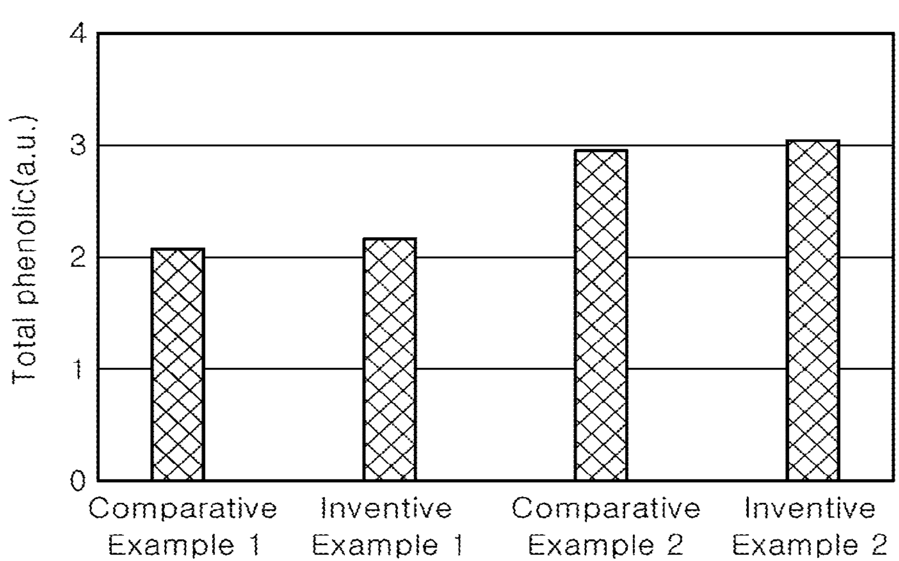
Figure 7D:
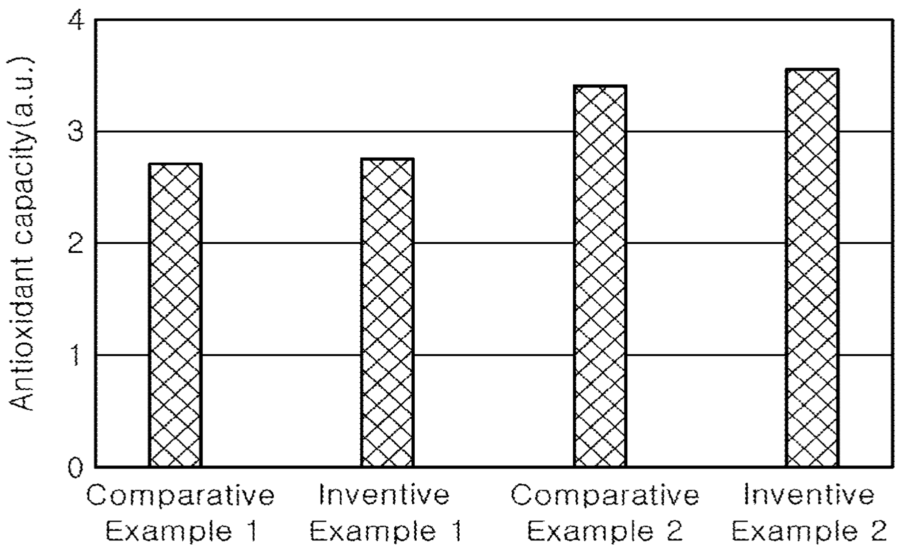

FIGS. 7C and 7D are graphs showing total phenolic contents and antioxidant capacities per cultivated plant.

As shown in FIG. 7C, Inventive Examples showed higher phenol contents than those of Comparative Examples under the same photometric condition. In addition, as shown in FIG. 7D, under the same photometric condition, Inventive Examples showed higher antioxidant capacities than those of Comparative Examples.

Figure 7E:
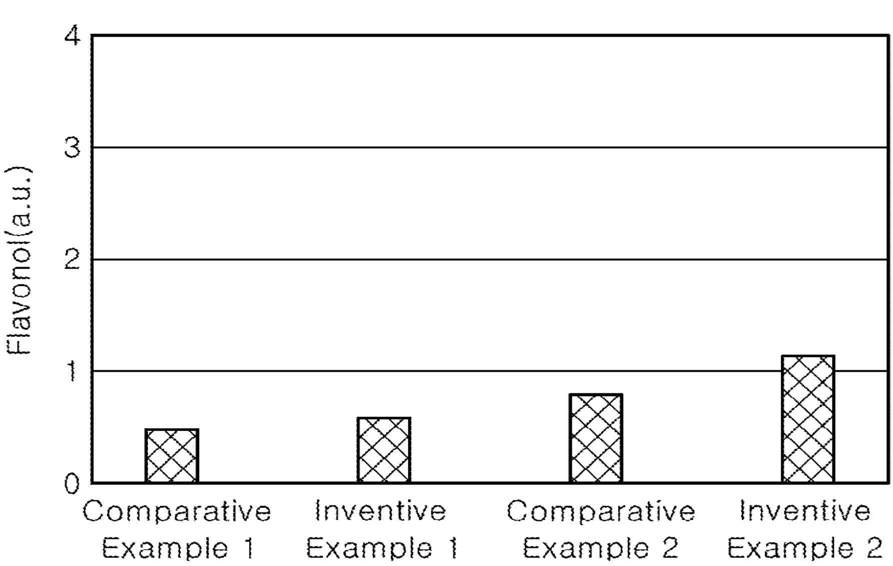
Figure 7F:
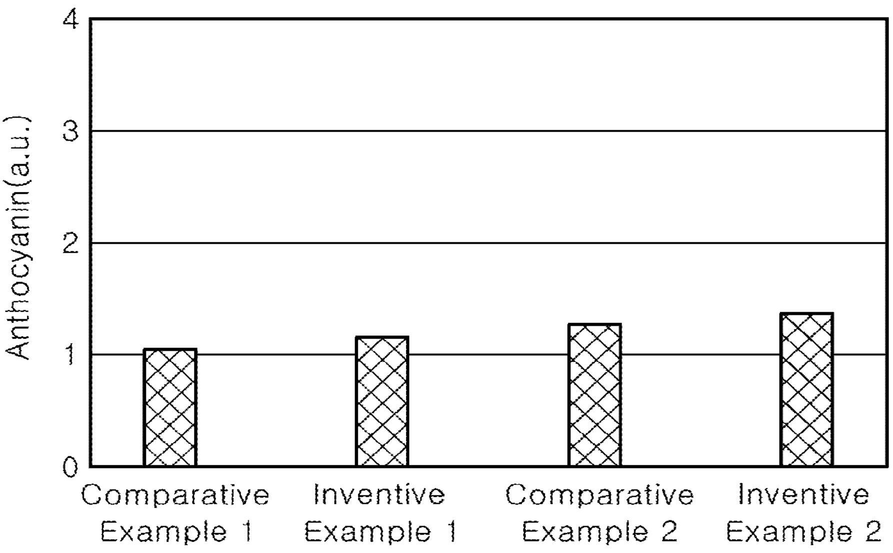

FIGS. 7E and 7F are graphs showing relative contents of flavonol and anthocyanin measured using duallex, a non-destructive plant composition analyzer.

As shown in FIGS. 7E and 7F, Inventive Examples showed higher flavonol contents and higher anthocyanin contents compared to those of Comparative Examples under the same photometric condition.

According to the exemplary embodiment of the present disclosure, it can be seen that the growth of plants is promoted by using the light source that emits white light having the basic spectrum similar to that of sunlight compared to a case of using conventional white light, and furthermore, it can be seen that total contents of the functional substances are increased.

In addition, light of a red spectrum which helps growth in volume of plants, light of a blue spectrum which increases densities of plants, or light of a ultraviolet spectrum to increase contents of functional substances may be added to light of the basic spectrum of the exemplary embodiment of the present disclosure.

FIGS. 8A through 8F are graphs illustrating results of plant cultivation depending on light sources according to another exemplary embodiment of the present disclosure and light sources according to Comparative Examples.

Figure 9:
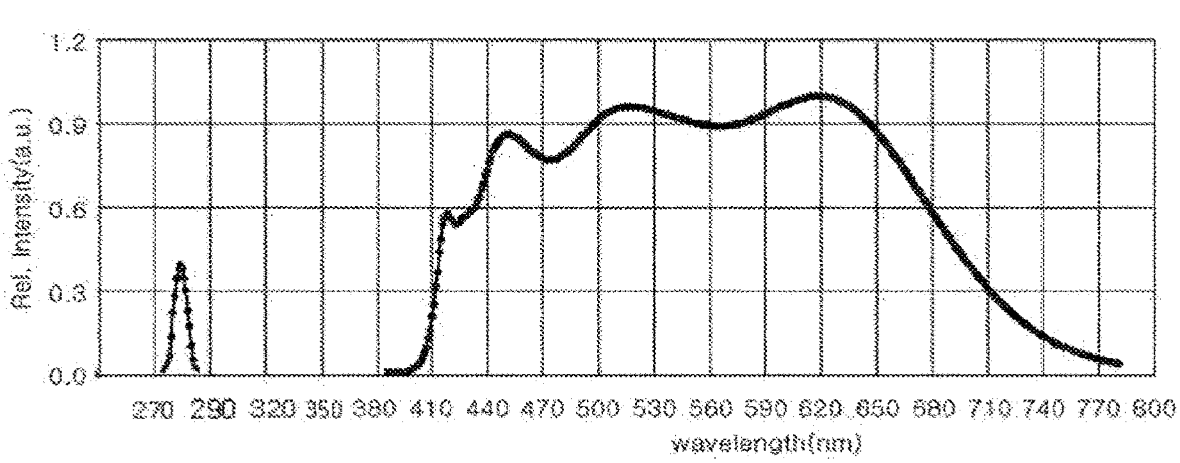
FIG. 9 is a graph illustrating spectrums of light source units for plant cultivation according to an exemplary embodiment.

Lettuce seedlings grown under the same conditions were divided into four groups of nine, and placed in a chamber at a room temperature of 20° C. and a relative humidity of 60%, respectively. The lettuce seedlings were grown for 2 weeks by irradiating the light sources of Inventive Examples 3 and 4 and the light sources of Comparative Examples 3 and 4 at a regular light cycle. Light sources of Inventive Example 3 and Comparative Example 3 are the same as those of Inventive Example 2 and Comparative Example 2 described above, respectively, and light sources of Inventive Example 4 and Comparative Example 4 were obtained by adding a 285 nm ultraviolet light source to the light sources of Inventive Example 3 and Inventive Example 4, respectively. The light spectrum of the light source of Inventive Example 4 is shown in FIG. 9. Light irradiation/quenching was repeated every 16 hours/8 hours, and the ultraviolet light source was continuously irradiated only for the last 24 hours. All of the light sources applied in the experiment emit white light having a color temperature of 5000K, and photometric conditions are all 200 PPFD.

Figure 8A:
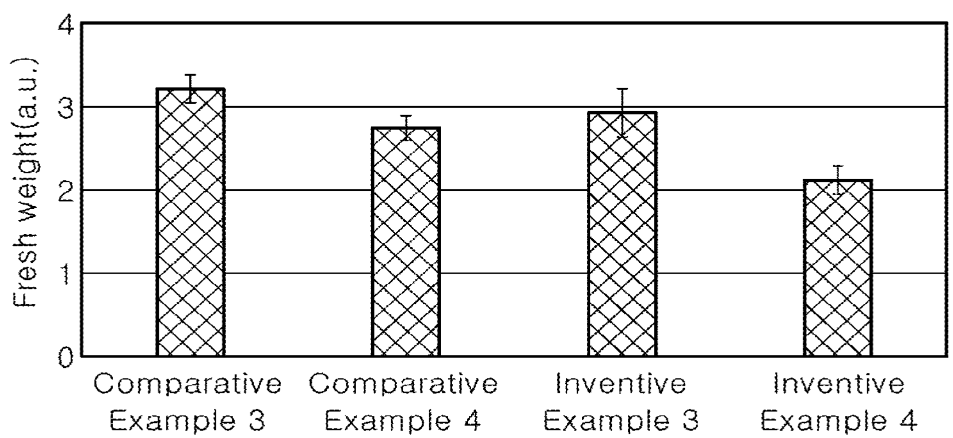
FIGS. 8A through 8F are graphs illustrating results of plant cultivation depending on light sources according to another exemplary embodiment of the present disclosure and light sources according to Comparative Examples.

FIG. 8A is a graph showing fresh weights of lettuces grown for 2 weeks. Referring to FIG. 8A, the fresh weights of lettuces additionally irradiated with ultraviolet light to white light were substantially reduced.

Figure 8B:
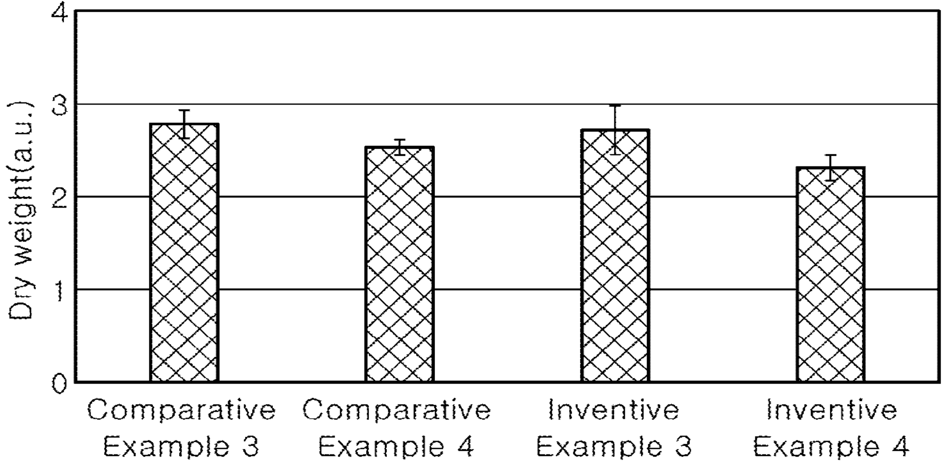

FIG. 8B is a graph showing dry weights thereof, showing a similar pattern to the fresh weights. The dry weights were generally within an error range, so there was no significant difference therebetween.

Figure 8C:
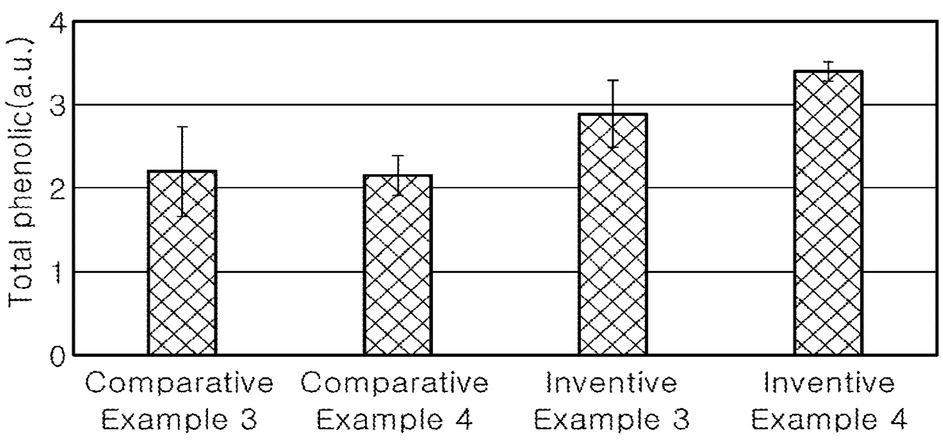
Figure 8D:
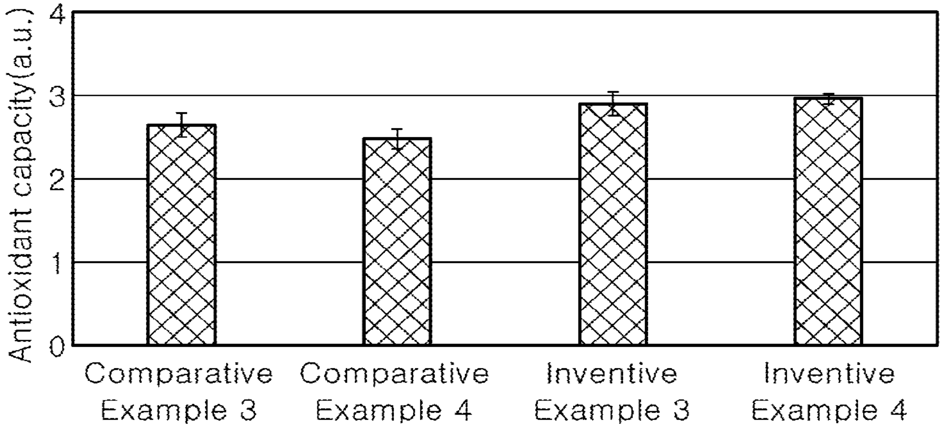

FIGS. 8C and 8D are graphs showing total phenolic contents and antioxidant capacities per cultivated plant.

As shown in FIG. 8C, Inventive Examples showed higher phenol contents than those of Comparative Examples under the same photometric condition. In addition, the lettuces grown by adding ultraviolet light to white light of Comparative Example 3 did not increase the phenol content, but it was found that the lettuces grown by adding ultraviolet light to white light of Inventive Example 3 increased the phenol content numerically.

In addition, as shown in FIG. 8D, Inventive Examples showed higher antioxidant capacities than Comparative Examples under the same photometric condition. However, in the antioxidant capacities, adding ultraviolet light to white light did not show a significant difference.

Figure 8E:
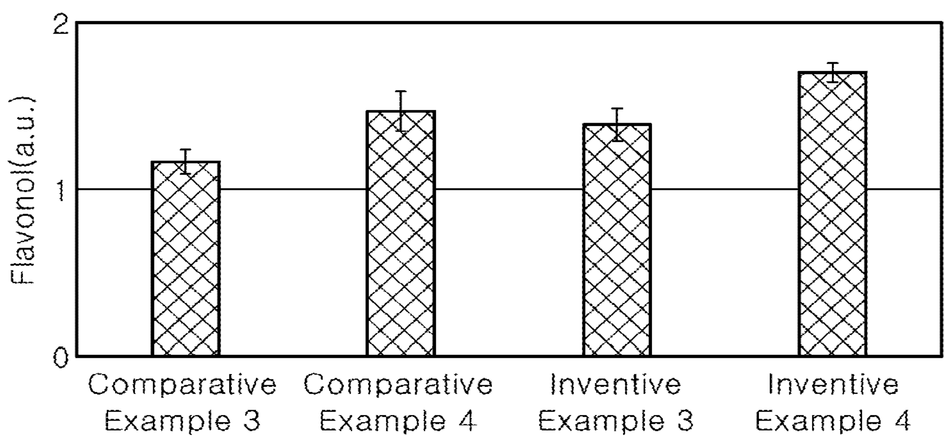
Figure 8F:
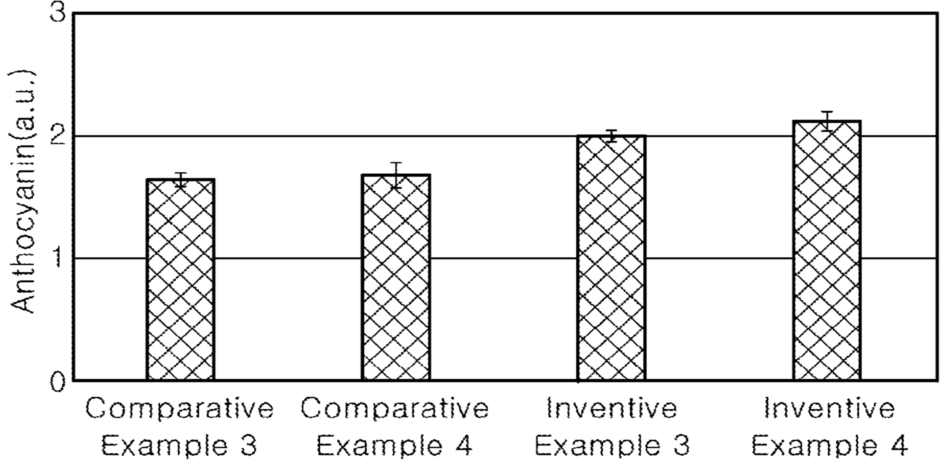

FIGS. 8E and 8F are graphs showing relative contents of flavonol and anthocyanin measured using duallex, a non-destructive plant composition analyzer.

As shown in FIGS. 8E and 8F, Inventive Examples showed higher flavonol contents and higher anthocyanin contents compared to those of Comparative Examples under the same photometric condition. In addition, when ultraviolet light was added to white light of Inventive Example 3, it was found that the flavonol content increased. However, the anthocyanin content was not significantly improved by adding ultraviolet light.

Based on the above, the phenol content and flavonol content can be increased by adding ultraviolet light to the light source emitting white light of the basic spectrum similar to that of sunlight compared to the case of using conventional white light.

FIG. 9 is a graph illustrating spectrums of light source units for plant cultivation according to an exemplary embodiment. As discussed above in connection with FIGS. 8A through 8F, adding ultraviolet light to the light source emitting white light of the basic spectrum may increase the phenol and flavonol contents. FIG. 9 illustrates that ultraviolet light is added to the basic spectrum. By way of example only, the wavelength of ultraviolet light may range between 270 nm and 290 nm but the present disclosure is not limited thereto.

What is claimed is:

1. A light emitting module, comprising:

a substrate configured to electrically connect to an external power supply;

a first light emitter disposed on the substrate and including a first light emitting diode configured to emit a primary light and a converter disposed on a path of the primary light emitted from the first light emitting diode to produce a first light; and a second light emitter disposed on the substrate and including a second light emitting diode configured to emit a second light having a peak wavelength that is different from a peak wavelength of the primary light, wherein combined light emitted from the first light emitter and the second light emitter produces a combined spectrum, wherein the combined spectrum includes a first peak wavelength, a second peak wavelength, and a third peak wavelength, wherein the second peak wavelength is between the first peak wavelength and the third peak wavelength, wherein one of the first peak wavelength or the third peak wavelength is in a blue light spectrum and another one of the first peak wavelength or the third peak wavelength is in a red light spectrum, wherein a difference between a relative intensity of the second peak wavelength and a relative intensity of the first peak wavelength is different from a difference between the relative intensity of the second peak wavelength and a relative intensity of the third peak wavelength, and wherein the relative intensity of the second peak wavelength is lower than the relative intensity of the third peak wavelength.

2. The light emitting module of claim 1, wherein the converter covers a surface of the first light emitting diode.

3. The light emitting module of claim 1, wherein the combined spectrum is obtained by adding a spectrum of the first light to a spectrum of the second light.

4. The light emitting module of claim 1, wherein a difference between the relative intensity of the first peak wavelength and at least one of the relative intensity of the second peak wavelength or the third peak wavelength is less than 20%.

5. The light emitting module of claim 1, wherein the peak wavelength of the second light is in one of a range of 620 nm to 680 nm or a non-visible light range.

6. The light emitting module of claim 1, wherein the difference between the relative intensity of the second peak wavelength and the relative intensity of the first peak wavelength is less than 30%.

7. The light emitting module of claim 1, wherein the difference between the relative intensity of the second peak wavelength and the relative intensity of the third peak wavelength is less than 20%.

8. A light emitting module, comprising:

a substrate configured to electrically connect to an external power supply;

a first light emitter disposed on the substrate and including a first light emitting diode configured to emit a primary light and a converter disposed on a path of the primary light emitted from the first light emitting diode to produce a first light; and a second light emitter disposed on the substrate and including a second light emitting diode configured to emit a second light having a peak wavelength that is different from a peak wavelength of the primary light, wherein combined light emitted from the first light emitter and the second light emitter produces a combined spectrum, wherein the combined spectrum includes a first peak wavelength, a second peak wavelength, and a third peak wavelength, wherein the second peak wavelength is between the first peak wavelength and the third peak wavelength, wherein the second peak wavelength has a full-width at half maximum that is wider than a full-width at half maximum for the first peak wavelength or a full-width at half maximum for the third peak wavelength, wherein one of the first peak wavelength or the third peak wavelength is in a blue light spectrum and another one of the first peak wavelength or the third peak wavelength is in a red light spectrum, and wherein a difference between a relative intensity of the second peak wavelength and a relative intensity of the first peak wavelength is lower than a difference between the relative intensity of the second peak wavelength and a relative intensity of the third peak wavelength.

9. The light emitting module of claim 8, wherein the combined spectrum is obtained by adding a spectrum of the first light to a spectrum of the second light.

10. The light emitting module of claim 8, wherein the second light emitted from the second light emitting diode has a full width at half maximum less than 10 nm.

11. The light emitting module of claim 8, wherein a difference between the relative intensity of the first peak wavelength and at least one of the relative intensity of the second peak wavelength or the third peak wavelength is less than 20%.

12. The light emitting module of claim 8, wherein the peak wavelength of the second light is in a range of 620 nm to 680 nm or a non-visible light range.

13. The light emitting module of claim 8, wherein the difference between the relative intensity of the second peak wavelength and the relative intensity of the first peak wavelength is less than 30%.

14. The light emitting module of claim 8, wherein the difference between the relative intensity of the second peak wavelength and the relative intensity of the third peak wavelength is less than 20%.

15. A light emitting module, comprising:

a substrate configured to electrically connect to an external power supply;

a first light emitter disposed on the substrate and including a first light emitting diode configured to emit a primary light and a converter disposed on a path of the primary light emitted from the first light emitting diode to produce a first light; and a second light emitter disposed on the substrate and including a second light emitting diode configured to emit a second light having a peak wavelength that is different from a peak wavelength of the primary light, wherein the first light has a first spectrum including a first peak wavelength and a second peak wavelength, wherein the second light has a second spectrum including a third peak wavelength, wherein the second peak wavelength has a full-width at half maximum that is wider than a full-width at half maximum for the first peak wavelength or a full-width at half maximum for the third peak wavelength, wherein one of the first peak wavelength or the third peak wavelength is in a blue light spectrum and another one of the first peak wavelength or the third peak wavelength is in a red light spectrum, and wherein a difference between a relative intensity of the first peak wavelength and a relative intensity of second peak wavelength is different from a difference between the relative intensity of the second peak wavelength and a relative intensity of the third peak wavelength, and wherein a difference between the relative intensity of the first peak wavelength and at least one of the relative intensity of the second peak wavelength or the third peak wavelength is less than 20%.

16. The light emitting module of claim 15, wherein the second light emitted from the second light emitting diode has a full width at half maximum less than 10 nm.

17. The light emitting module of claim 15, wherein the first light includes a white light having a color temperature of 5000K or more.

18. The light emitting module of claim 15, wherein the peak wavelength of the second light is in one of a range of 620 nm to 680 nm or a non-visible light range.

19. The light emitting module of claim 15, wherein a difference between the relative intensity of the first peak wavelength and the relative intensity of at least one of the second peak wavelength or the third peak wavelength is less than 10%.

20. The light emitting module of claim 15, wherein the converter covers a surface of the first light emitting diode.

* * * * *